(12) United States Patent
Krenek et al.

(10) Patent No.: US 12,341,517 B2
(45) Date of Patent: Jun. 24, 2025

(54) SYSTEM WITH A LOW-DRIFT ON-CHIP OSCILLATOR WITH LOWERED SENSITIVITY TO RANDOM TELEGRAPH NOISE

(71) Applicant: EM Microelectronic-Marin SA, Marin (CH)

(72) Inventors: Oskar Krenek, Praha-Kolodeje (CZ); Christoph Kuratli, La Neuveville (CH)

(73) Assignee: EM Microelectronic-Marin SA, Marin (CH)

( * ) Notice: Subject to any disclaimer, the term of this patent is extended or adjusted under 35 U.S.C. 154(b) by 50 days.

(21) Appl. No.: 18/503,241

(22) Filed: Nov. 7, 2023

(65) Prior Publication Data

US 2024/0204758 A1 Jun. 20, 2024

(30) Foreign Application Priority Data

Dec. 15, 2022 (EP) .................................. 22213921

(51) Int. Cl.
*H03K 3/03* (2006.01)
*H03K 3/01* (2006.01)
*H03K 3/013* (2006.01)

(52) U.S. Cl.
CPC ............. *H03K 3/0315* (2013.01); *H03K 3/01* (2013.01); *H03K 3/013* (2013.01)

(58) Field of Classification Search
CPC ..... H03K 3/013; H03K 3/0315; H03K 3/0322
USPC ......................................................... 331/57
See application file for complete search history.

(56) References Cited

U.S. PATENT DOCUMENTS

| | | | |
|---|---|---|---|
| 9,509,289 B2 * | 11/2016 | Kobayashi | ............ H03L 7/0995 |
| 10,819,317 B1 * | 10/2020 | Lahiri | .................. H03K 3/0315 |
| 10,979,068 B1 * | 4/2021 | Tseng | ...................... H03L 7/099 |
| 11,705,897 B2 * | 7/2023 | Zhang | .................... H03K 5/131 |
| | | | 455/73 |

(Continued)

FOREIGN PATENT DOCUMENTS

| | | |
|---|---|---|
| CN | 213906643 U | 8/2021 |
| JP | 2013-214915 A | 10/2013 |

OTHER PUBLICATIONS

Extended European Search Report issued Jun. 15, 2023 in European Application 22213921.4 filed on Dec. 15, 2022, 15 pages (with Written Opinion).

(Continued)

*Primary Examiner* — Levi Gannon
(74) *Attorney, Agent, or Firm* — Oblon, McClelland, Maier & Neustadt, L.L.P.

(57) ABSTRACT

A system with a low-drift on-chip (LD-RC) oscillator with lowered sensitivity to Random Telegraph Noise when generating a current (Id) for the LD-RC oscillator. A control resistor (R) is connected through an intermediary arrangement to one of a first MOS transistor (M1) or of a second MOS transistor (M2) between two terminals of a supply voltage source (Vdd). The gate of the first MOS transistor (M1) is connected to the gate of the second MOS transistor (M2), whereas the source of the first MOS transistor (M1) and the source of the second MOS transistor (M2) are connected to one terminal of the supply voltage source (Vdd), the control resistor (R) being connected to the other opposite terminal of the supply voltage source.

9 Claims, 3 Drawing Sheets

(56) References Cited

U.S. PATENT DOCUMENTS

| | | | |
|---|---|---|---|
| 11,736,112 B2* | 8/2023 | Choo | H03L 7/0995 |
| | | | 327/159 |
| 2008/0106345 A1* | 5/2008 | Huang | H03L 7/0995 |
| | | | 331/57 |
| 2013/0002361 A1* | 1/2013 | Coban | H03K 3/0315 |
| | | | 331/108 R |
| 2019/0229713 A1* | 7/2019 | Krishna | H03K 3/011 |

OTHER PUBLICATIONS

Coustans et al. "A nA Crystal-Less Oscillator for Internet of Things" 23rd International Conference Mixed Design of Integrated Circuits and Systems, Lodz University of Technology, 2016, 4 pages.

* cited by examiner

US 12,341,517 B2

SYSTEM WITH A LOW-DRIFT ON-CHIP OSCILLATOR WITH LOWERED SENSITIVITY TO RANDOM TELEGRAPH NOISE

CROSS-REFERENCE TO RELATED APPLICATION

This application claims priority to European Patent Application No. 22213921.4 filed on Dec. 15, 2022, the entire disclosure of which is hereby incorporated herein by reference.

FIELD OF THE INVENTION

The present disclosure relates to a system with a low-drift on-chip oscillator with lowered sensitivity to Random Telegraph Noise (RTN). The oscillator can be a ring oscillator continuous in operation and fully integrated with very low power in a system-on-chip (SOC).

The present disclosure relates to a method for lowering sensitivity to Random Telegraph Noise (RTN) of a system with a low-drift on-chip oscillator.

BACKGROUND OF THE INVENTION

Low-drift fully integrated low power oscillators in system-on-chip are developed in modern deep submicron CMOS technologies for all sorts of applications. The term "fully integrated" means that the low-drift RC oscillator (LD-RC) does not need an external component (e.g. precise capacitor, resistor or crystal), which is attractive since it saves cost and allows miniaturization.

LD-RC oscillators are typically needed in battery powered RF-SOC's (RF=radio-frequency) as precise time base for the "Sleep-modes" of the system where power consumption is minimized. Often, in such sleep modes only a digital timer is operating clocked by the LD-RC, which wakes-up the system to become active after a predefined time. This time needs to be precise to meet certain RF standards (e.g. from the Bluetooth standard) which is made to ensure proper interoperation of different RF-devices. Unfortunately, the presence of RTN in modern deep submicron CMOS technologies can jeopardize the required timing precision.

While a fully integrated LD-RC oscillator can be done in many different ways, not all oscillator architectures are well suited for battery powered applications where minimized consumption (<500 nA) and low supply voltages (1V) are crucial. Likewise, not all LD-RC designs suffer from RTN reducing the precision of the oscillator's output frequency. A widely used class of very low power low voltage RC oscillators can be used as LD-RC oscillator (see FIG. 1). However, these oscillators are susceptible to RTN effects and hence cannot be well used as precise time base for sleep modes without extra precautions.

In FIG. 1, an RC oscillator is shown composed of an oscillator core 10, which comprises an odd number n of inverters 11, 12, 13 connected in series and forming a ring. In this example, three inverters 11, 12, 13 are used, which generate at the output an oscillating signal at a frequency F0. One of three identical capacitor Co is connected between the output of each inverter 11, 12, 13 and the ground (0 V). One can consider that each capacitor Co is partly or fully intrinsic to each inverter 11, 12, 13. The current Id is defined by the following equation:

$Id = F_0 \cdot C \cdot Vc$ where $C = n \cdot Co$ ($n$ is the number of inverters), $Vc$ is the voltage across capacitor $Cc$, and is also the voltage supply for each inverter 11, 12, 13 with respect to ground.

The current Id is supplied by a current source 16 connected to a supply voltage Vdd and controlled by a controlled voltage signal Vcont, Id powers inverters 11, 12, 13. Depending on the application of the system with the on-chip LD-RC as mentioned above, the effects of RTN noise can be modelled by a parasitic current source 17 in parallel to current source 16. This modifies the current Id for the ring oscillator core. Said parasitic current In randomly varies and is a perturbation of the operation of the system. It reduces the precision of the predefined time in particular for Sleep modes, which is a drawback of the system of the prior art.

In FIG. 2, the LD-RC oscillator 10 is applied in a sleep logic unit 20 of an RF-System-on-chip application. In particular, FIG. 2 shows how the LD-RC oscillator 10 is applied as part of "Sleep modes" of an RF-SOC. It is used as clock source of a sleep-timer 21, which after a start signal given by an overall system control counts Nwu clock pulses until the wake-up signal is asserted. The wake-up signal starts the system into Active modes where for example, power hungry RF activities are performed. RTN noise on the current sources makes the target time for "Tsleep" imprecise, which is a drawback of the system of the prior art.

In FIG. 3, a current starved RC oscillator is applied to build a low-drift oscillator in the SOC according to prior art. This system with said oscillator suffers from susceptibility to RTN noise.

The SOC comprises an LD-RC oscillator, which can be a ring oscillator 10. Said ring oscillator 10 includes an odd number n of inverters, for example composed of three inverters 11, 12, 13 serially connected to form a ring, and which in operation generates an oscillating signal at a frequency F0. To provide a current Id for the ring oscillator 10, the system includes a control resistor R connected to a first MOS transistor M1 between two terminals of a supply voltage source, which can be a battery (not shown). The control resistor R is connected to the drain of the first MOS transistor M1. The source of the first MOS transistor M1 is connected in direction to one terminal of the supply voltage source Vdd, whereas the resistor R is connected to the other opposite terminal of the supply voltage source. The gate of the first MOS transistor M1 is connected to the gate of a second MOS transistor M2, whose source is connected in direction to the same terminal of the supply voltage source as the first MOS transistor M1. Since the dimensions of M1 and M2 are set to be the same, their corresponding drain currents become the same as well.

The LD-RC circuit is based on the balance between the DC current flowing into the on-chip resistor R and the current Id supplied to the ring oscillator 10 made of an odd number of CMOS inverters. The balance is ensured via a feedback unit, which is implemented by an operational amplifier 40 in the depicted case. The amplifier 40 compares the voltage Vr generated by the current Is through the control resistor R to the supply voltage Vc generated by the current Id through the inverters 11, 12, 13 of the ring oscillator, filtered by the on-chip capacitor Cc. The output VrP of the operational amplifier 40 is provided to the control gates of the two MOS transistors M1 and M2 in order to adapt the currents Id and Is.

The embodiment shown in FIG. 3 concerns a current pair through the two MOS transistors M1 and M2, which are PMOS transistors connected by their source directly to the terminal of the supply voltage source Vdd. The control resistor R is connected to the other terminal of the supply voltage source, which is the ground.

However it is noted that it is possible to have an alternative embodiment, with two MOS transistors M1 and M2, which are NMOS transistors connected by their source directly to the ground. The ring oscillator 10, the capacitor Cc and the control resistor R are connected to the terminal of the supply voltage source Vdd.

The problem described by the system on chip with the LD-RC oscillator 10 of the prior art concerns mainly the issue of RTN noise.

This noise is caused by electrons trapped in RTN traps for example in gate dielectric. The temporal fluctuation of transistor threshold voltage (Vth) caused by RTN traps results in clock period fluctuation. RTN can also be characterized by the trap and release times (which vary with temperature and gate-channel bias voltage). Actual electron trapping or releasing event is random in occurrence. Observation intervals concerning a defined time, such as sleep time ("Tsleep", see FIG. 2) shorter than the trap or release times might be influenced much more than those which are much longer then trap or release times. Oscillator frequency is changed by temporal transistor threshold voltage change (e.g. ΔVth at TVth).

Major contributors of RTN noise in LD-RC oscillator are PMOS current sources M1 and M2. Relative frequency change due to RTN noise is very small (usually in range of hundreds of ppm) so we can consider it as superposition in a linearized system. That means a small change of current from M2 device causes a small change of oscillator frequency while the same change of current from M1 device causes the same change of oscillator frequency but in opposite direction.

SUMMARY OF THE INVENTION

This patent application relates to a low-drift fully integrated low power oscillator in system-on-chip (SOC) with lowered sensitivity to Random Telegraph Noise (RTN) typically coming along in modern deep submicron CMOS technologies. "Fully integrated" means that the low-drift RC oscillator (LD-RC) does not need an external component (e.g. precise capacitor, resistor or crystal), which is attractive since it saves cost and allows miniaturization in the application. Furthermore, the invention relates to a method for lowering RTN sensitivity of a system using a low-drift fully integrated low power oscillator.

The above-mentioned drawbacks are solved by the system with a low-drift on-chip oscillator with lowered sensitivity to Random Telegraph Noise (RTN) in accordance to the features of the independent claim 1. Preferred embodiments are subject matter of the dependent claims.

The above-mentioned drawbacks are solved by the method for lowering sensitivity to Random Telegraph Noise (RTN) of a system in operation with a low-drift on-chip oscillator in accordance to the features of the independent claim 8. Preferred steps of the method are subject matter of the dependent claims dependent on claim 8.

An advantage is that regularly interchanging current sources M1 and M2 and having each one connected to ring oscillator or control resistor for in total 50% of the time should decrease time measurement variation substantially. For that chopping switches are provided between transistors M1, M2 and the control resistor and the ring oscillator in order to commute the current in each connection branches.

Preferably, the commutation is performed by the two control phases P1 and P2 and each phase approximately occupies 50% of the time.

Thanks to this, it is possible to reduce the sensitivity to Random Telegraph Noise (RTN) in particular in modern deep submicron CMOS technologies lower than 65 nm.

BRIEF DESCRIPTION OF THE DRAWINGS

In the following, an example of a system with a low-drift on-chip oscillator with lowered sensitivity to Random Telegraph Noise (RTN) illustrated and described in greater detail by making reference to the drawings, in which.

DETAILED DESCRIPTION OF THE INVENTION

Figure 3:
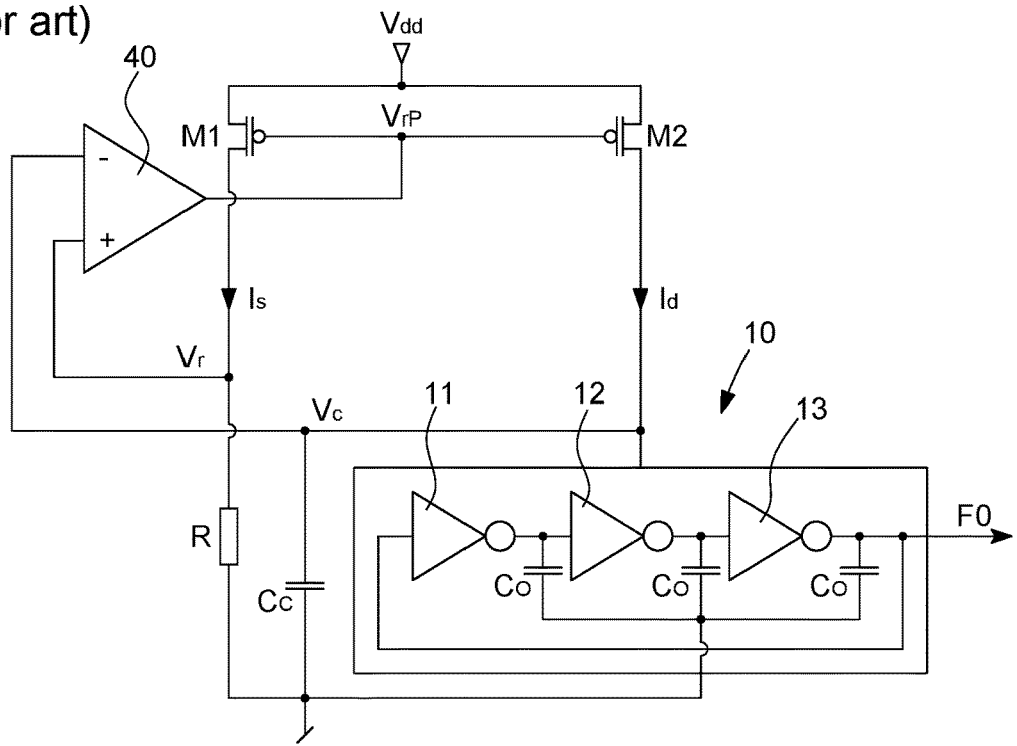
Figure 4:
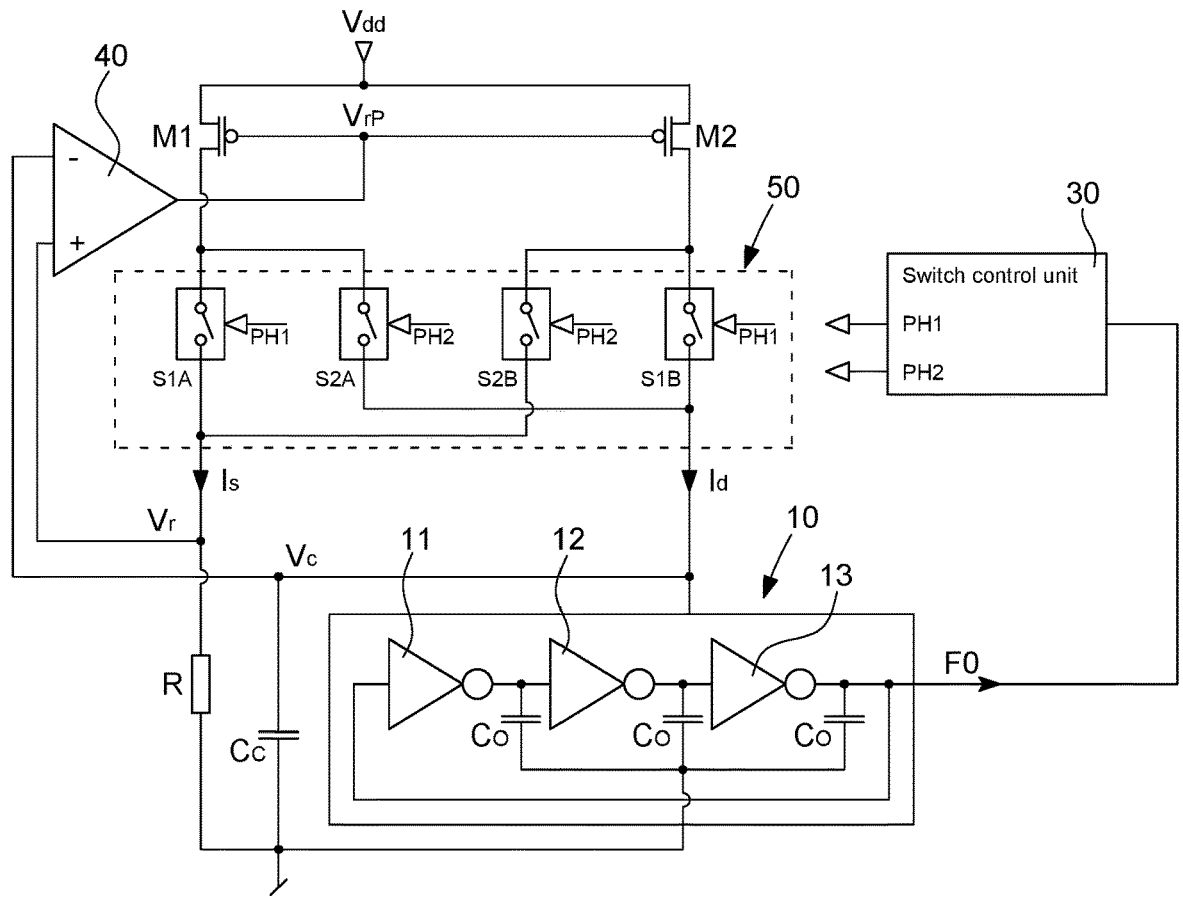

In FIG. 4, the system-on-chip with the low drift RC oscillator comprises several parts identical to the above mentioned system described in FIG. 3 and is repeated below. However, the system-on-chip (SOC) with the LD-RC oscillator of the present invention provides lower sensitivity to Random Telegraph Noise. The components described in reference of FIG. 4 constitute mainly an oscillator stage.

The SOC comprises an LD-RC oscillator. Said LD-RC oscillator can preferably be a ring oscillator 10, which includes an odd number n of inverters, for example composed of three inverters 11, 12, 13 serially connected to each other forming a ring, in operation providing at the output an oscillating signal at frequency F0.

For generating a current Id for the LD-RC oscillator for example the ring oscillator 10, the system includes a control resistor R connected through an intermediary arrangement 50 to one of a first MOS transistor M1 or of a second MOS transistor M2 between two terminals of a supply voltage source, which can be a battery not shown. The gate of the first MOS transistor M1 is connected to the gate of the second MOS transistor, whereas the source of the first MOS transistor M1 and the source of the second MOS transistor M2 are connected in direction to one terminal of the supply voltage source Vdd. The control resistor R is connected to the other opposite terminal of the supply voltage source.

According to the present invention, the intermediary arrangement 50 includes controlled chopping switches S1A, S1B, S2A, S2B placed between the control resistor R and the first and second MOS transistors M1, M2, and between the LD-RC oscillator 10 and the first and second MOS transistors M1, M2.

A first controlled chopping switch S1A is placed between the control resistor R and a drain of the first MOS transistor M1 of a first branch, whereas a second controlled chopping switch S1B is placed between the LD-RC oscillator 10 and a drain of the second MOS transistor M2 of a second branch. A third controlled chopping switch S2B is placed between the control resistor R and the drain of the second MOS transistor M2, whereas a fourth controlled chopping switch S2A is placed between the LD-RC oscillator 10 and the drain of the first MOS transistor M1.

During a first phase P1, the first and second switches S1A and S1B are controlled by a first control signal PH1 to be in conducting mode in order to connect the resistor R to the drain of the first MOS transistor M1, and to connect the LD-RC oscillator 10 to the drain of the second MOS transistor M2. During the first phase P1, the third switch S2B and the fourth switch S2A are in open state (i.e. in non-conducting mode).

During a second phase P2, the third and fourth switches S2B and S2A are controlled by a second control signal PH2 to be in conducting mode in order to connect the resistor R to the drain of second MOS transistor M2, and to connect the LD-RC oscillator 10 to the drain of the first MOS transistor M1. During the second phase P2, the first switch S1A and the second switch S1B are in open state (i.e. in non-conducting mode).

Figure 1:
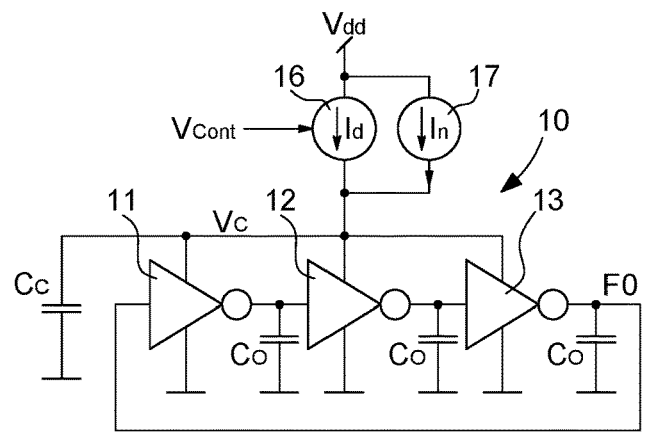
FIG. 1 schematically illustrates an oscillator circuit using a ring oscillator of the prior art, FIG. 2 schematically illustrates a sleep timer unit controlled by the oscillator to determine a defined time corresponding to a a sleep time of the prior art and used also in the present invention, FIG. 3 schematically illustrates a system-on-chip with a ring oscillator subject to effects of the RTN noise of the prior art, FIG. 4 schematically illustrates a system-on-chip with an LD-RC oscillator with lowered sensitivity to Random Telegraph Noise (RTN) according to the present invention.
Figure 2:
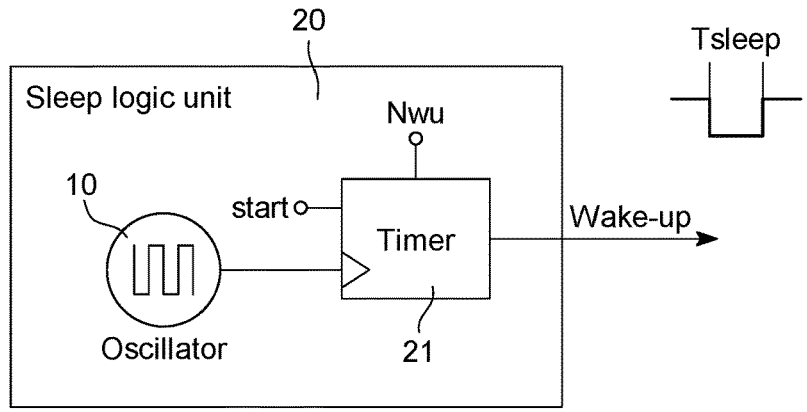

The control signals PH1 and PH2 serve as "chopping" signals. Filtering of the "chopping" frequency is accomplished in the digital counter serving as digital integrator/low pass filter, as shown and described in relation of FIG. 2, used for time interval measurement.

The control signals PH1 and PH2 are generated in the switch control unit 30 for chopping switches, and preferably controlled by the clock frequency F0 from the ring oscillator 10. So the switch control unit 30 and the ring oscillator 10 can be a part of the sleep timer unit 20 described in reference of FIG. 2. The implementation of signals PH1 and PH2 should provide switches S1A, S1B to be in conducting mode while switches S2A, S2B to be in non-conducting mode for close to 50% of time and switches S2A, S2B to be in conducting mode while switches S1A, S1B to be in non-conducting mode for the rest of time. It can be done in simple repetitive mode, pseudorandom mode with 50% duty cycle (spread Spectrum) or any other way providing close to 50% duty cycle of chopping signals over reasonably long time interval (reasonably long time interval is related to the oscillator application e.g. to the lengths of used time intervals in application). As abovementioned, the oscillator output clock F0 might be used as an input signal for the switch control unit 30. Simplest solution is divide-by-N (N=natural number) with 50% duty cycle. Any other clock signal (not provided by this RC oscillator and not related to this RC oscillator but available in SOC) can be also used as input signal of the switch control unit 30 of chopping switches. The chopping intervals do not need to be an exact multiple of RC oscillator period.

The oscillator circuit is based on the equal balance between the DC current Is flowing into the on-chip resistor R and the current Id supplied to the ring oscillator 10 made of an odd number n of CMOS inverters. The balance is ensured via a feedback unit, which is implemented by an operational amplifier 40 in the depicted case. The amplifier 40 compares the voltage Vr generated by the current Is through the control resistor R to the supply voltage Vc generated by the current Id through the inverters 11, 12, 13 of the ring oscillator, filtered by the on chip capacitor Cc. The output VrP of the operational amplifier 40 is provided to the control gates of the two MOS transistors M1 and M2 in order to adapt the currents Id and Is.

The embodiment shown in FIG. 4 concerns a current pair through the two MOS transistors M1 and M2, which are PMOS transistors connected by their source directly to the terminal of the supply voltage source Vdd. The control resistor R is connected to the other terminal of the supply voltage source, which is the ground.

However it is noted that it is possible to have an alternative embodiment, with two MOS transistors M1 and M2, which are NMOS transistors connected by their source directly to the ground. The ring oscillator 10, the capacitor Cc and the control resistor R are connected to the terminal of the supply voltage source Vdd.

Figure 5:
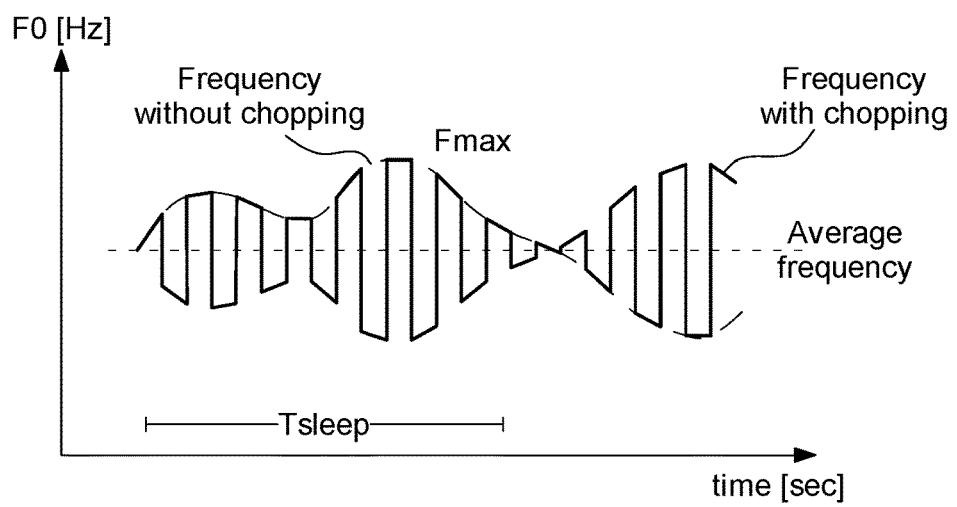
FIG. 5 illustrates two graphs, the first graph showing the frequency signal F0 without chopping and the second graph showing the frequency signal with chopping of the present invention to reduce the RTN noise.

FIG. 5 illustrates two superposed graphs, whose first graph showing the frequency signal F0 without chopping and the other graph showing the frequency signal with chopping of the present invention to reduce the RTN noise. All switches are commuted during all first phases and second phases and during the defined time corresponding in this case to the period of the sleep time. In this example phases P1 and phases P2 alternate successively during a period corresponding to 8 times (P1+P2). However, the chopper needs to be on all the time during sleep modes and also when the system is entirely activated.

Mainly it is in sleep mode where it is necessary to have an exact time before the SOC is changed to a mode where all components of the general system are active, for example to be able to communicate by RF signals with other devices. The presence of RTN noise makes the time during the sleep mode imprecise, which is disliked in RF communication applications since power the hungry active modes then have to be turned on longer. The oscillator of the system is staying active continuously and it is necessary to have a small consumption during the phases of sleep mode.

Figure 6:
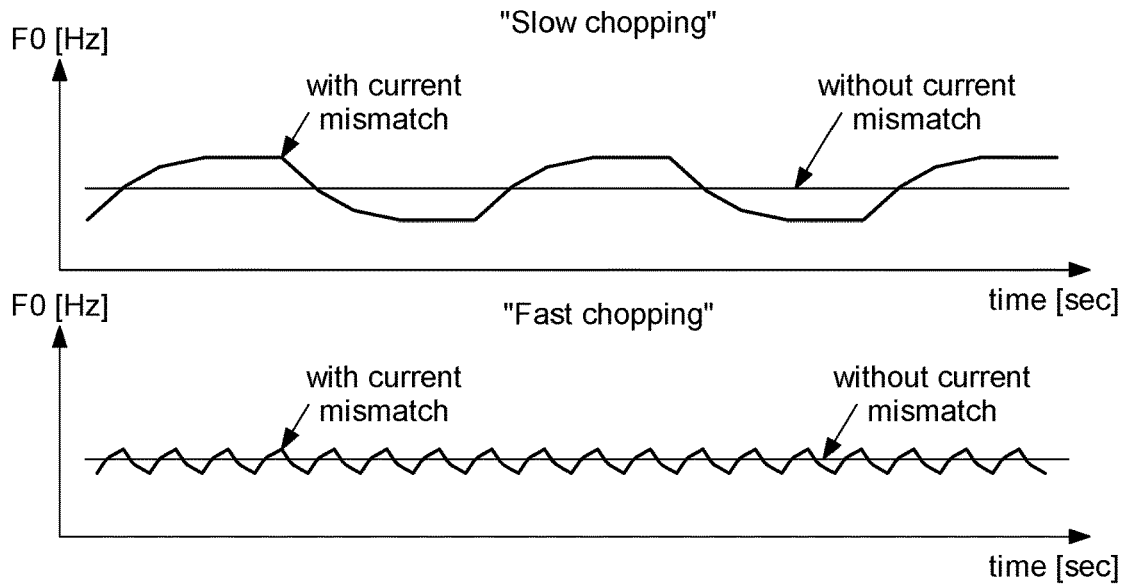
FIG. 6 illustrates graphs of slow chopping and fast chopping with current mismatch and without current mismatch, and FIG. 7 schematically illustrates a variant of FIG. 4 of the system-on-chip with an LD-RC oscillator with lowered sensitivity to Random Telegraph Noise (RTN) with a cascode arrangement in an intermediary part of the present invention.

In FIG. 6, the two graphs show slow chopping and fast chopping with current mismatch and without current mismatch (on transistors M1 and M2). It is generally better to select fast chopping to have less variations of the frequency signal F0 in time.

In both slow- and fast chopping the averaging of the chopper frequency happens in the digital counter/integrator. To avoid residual frequency variations due to M1 and M2 mismatch, the observation interval ("Tsleep") is best chosen as an integer number of the chopper frequency interval. Fast chopping here has the advantage that in case Tsleep cannot be made in such a way, the residual frequency error is still small since many chopper intervals for a given Tsleep reduce it. But it comes along with higher dynamic consumption.

Figure 7:
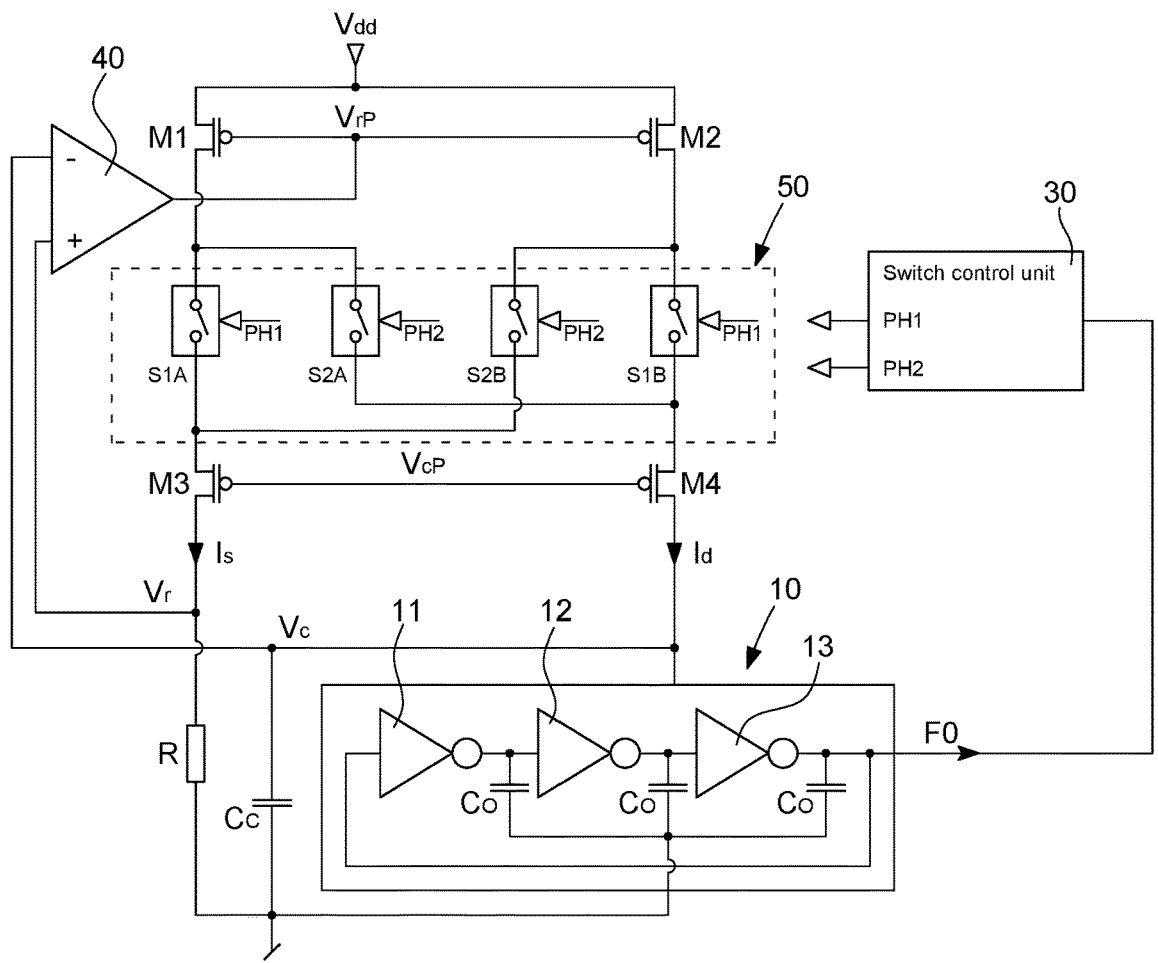

FIG. 7 shows only a variant embodiment of FIG. 4. In case the (Vc-Vr) regulation loop uses built-in temperature dependent offset-voltage (in differential pair of operational amplifier) for temperature compensation of oscillator frequency, the cascode MOS transistors M3 and M4 are added and placed between the arrangement of controlled chopping switches S1A, S1B, S2A, S2B, and the control resistor R and also the ring oscillator 10. Said cascode transistors are provided to minimize drain voltage changes of M1 and M2 current sources during switching phases PH1 and PH2 and hence decrease frequency overshoots or undershoots after switching events (interchange between M1 and M2 current sources). Cascode transistors do not have any further influence on RTN noise improvement. Furthermore, the potential VcP applied to the gates of transistors M3 and M4 has to be well selected and preference to have transistors PMOS for all the transistors M1 to M4.

It is to be noted that the frequency instability can cause inaccuracy in very accurate timing systems and prevent it to operate properly. The proposed "chopping systems with chopping control signals and output filtering" decreases RTN noise impact on frequency/timing instability. Compared to prior art, improvement can be achieved without local supply voltage increase. RTN noise improvement implemented via "chopping" might be higher than maximal improvement achievable by "prior art techniques".

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be considered as limiting the scope of the invention.

On the basis of the above description, several variants of the system with the low-drift on-chip oscillator with lowered sensitivity to Random Telegraph Noise (RTN) can be designed by the skilled person without falling outside the scope of the invention defined by the claims.

The invention claimed is:

1. A system with a low-drift on-chip oscillator with lowered sensitivity to Random Telegraph Noise, for generating a current (Id) in operation for the LD-RC oscillator, said system comprising a control resistor (R) connected through an intermediary arrangement to one of a first MOS transistor (M1) or of a second MOS transistor (M2) between two terminals of a supply voltage source (Vdd), the gate of the first MOS transistor (M1) is connected to the gate of the second MOS transistor (M2), whereas the source of the first MOS transistor (M1) and the source of the second MOS transistor (M2) are connected in direction to a first terminal of the supply voltage source (Vdd), the control resistor (R) being connected to a second terminal opposite to the first terminal of the supply voltage source, and the system comprising still a feedback unit, which is an operational amplifier for a comparison of a voltage (Vr) generated by a current (Is) through the control resistor R and a supply voltage (Vc) generated by the current (Id) through the LD-RC oscillator, an output (VrP) of the operational amplifier being connected to gates of the first and second MOS transistors (M1, M2), the intermediary arrangement including chopping switches (S1A, S1B, S2B, S2A) controlled by a switch control unit which is intended to be clocked by the frequency signal (F0) of the LD-RC oscillator in operation and placed between the control resistor (R) and the first and second MOS transistors (M1, M2), and between the LD-RC oscillator and the first and second MOS transistors (M1, M2), a first controlled chopping switch (S1A) being placed between the control resistor (R) and the drain of the first MOS transistor (M1) of a first branch, whereas a second controlled chopping switch (S1B) is placed between the LD-RC oscillator and the drain of the second MOS transistor (M2) of a second branch, a third controlled chopping switch (S2B) being placed between the control resistor (R) and the drain of the second MOS transistor (M2), whereas a fourth controlled chopping switch (S2A) is placed between the LD-RC oscillator and the drain of the first MOS transistor (M1), the first and second switches (S1A, S1B) being intended to be controlled by a first control signal (PH1) from the switch control unit intended to be in conducting mode during a first phase P1, whereas the third and fourth switches (S2B, S2A) are intended to be controlled by a second control signal (PH2) from the switch control unit intended to be in non-conductive mode during the first phase P1, and the third and fourth switches (S2B, S2A) being intended to be controlled by the second control signal (PH2) intended to be in conducting mode during a second phase P2, whereas the first and second switches (S1A, S1B) are intended to be controlled by the first control signal (PH1) intended to be in non-conductive mode during the second phase P2, wherein the LD-RC oscillator is a ring oscillator having an odd number n of inverters, which are connected in series to form a ring.

2. The system according to claim 1, wherein the ring oscillator comprises three inverters connected in series, an output of the first inverter being connected to an input of the second inverter, an output of the second inverter being connected to an input of the third inverter, and an output of the third inverter being connected to an input of the first inverter in order to form a ring, the output of the third inverter generating the frequency signal (F0), which is an oscillating signal at a frequency F0, and wherein the oscillating signal is a sinusoidal signal or a square signal or a triangular signal or a sawtooth signal.

3. The system according to claim 2, wherein each inverter has an intrinsic capacitor Co, and wherein in operation, the current Id is defined by the equation: $Id = F0 \cdot C \cdot Vc$, with $C = n \cdot Co$ and Vc being the voltage across a capacitor Cc connected to the inverters and is the voltage supply for each inverter of the ring oscillator of the system with respect to the second supply terminal, and which is provided to be always active during different system intervals or times, in particular during sleep times of the system.

4. The system according to claim 1, wherein the first and second MOS transistors (M1, M2) are PMOS transistors with their source connected to the first terminal, which is the terminal of the supply voltage Vdd, and wherein the control resistor (R) and the LD-RC oscillator are connected to the second terminal, which is the ground.

5. The system according to claim 1, wherein cascade MOS transistors (M3, M4) are added and placed between the arrangement of controlled chopping switches (S1A, S1B, S2A, S2B), and the control resistor (R) and also the LD-RC oscillator, in that a first cascade MOS transistor (M3) is connected to the resistor (R) in one side and in other side to the first and third switches (S1A, S2B), whereas a second cascade MOS transistor (M4) is connected in one side to the LD-RC oscillator, and in the other side to the second and fourth switches (S1B, S2A).

6. The system according to claim 5, wherein cascade MOS transistors (M3, M4) are PMOS transistors, and wherein first and second MOS transistors (M1, M2) are PMOS transistors with their source connected to the first terminal, which is the terminal of the supply voltage Vdd, whereas the control resistor (R) and the LD-RC oscillator are connected to the second terminal, which is the ground.

7. A method for lowering sensitivity to Random Telegraph Noise of a system with a low-drift on-chip oscillator in an oscillator stage for generating a current (Id) for the LD-RC oscillator, said system comprising a control resistor (R) connected through an intermediary arrangement to one of a first MOS transistor (M1) or of a second MOS transistor (M2) between two terminals of a supply voltage source (Vdd), the gate of the first MOS transistor (M1) being connected to the gate of the second MOS transistor (M2), whereas the source of the first MOS transistor (M1) and the source of the second MOS transistor (M2) are connected in direction to a first terminal of the supply voltage source (Vdd), the control resistor (R) being connected to a second terminal opposite to the first terminal of the supply voltage source (Vdd), and the system comprising in the oscillator stage still a feedback unit, which is an operational amplifier in operation for the comparison between a voltage (Vr) generated by a current (Is) through the control resistor R and a supply voltage (Vc) generated by the current (Id) through the LD-RC oscillator, an output (VrP) of the operational amplifier being connected to gates of the first and second MOS transistors (M1, M2), for implementing the method, the intermediary arrangement includes first, second, third, fourth controlled chopping switches (S1A, S1B, S2B, S2A) controlled by a switch control unit, placed between the control resistor (R) and the first and second MOS transistors (M1, M2), and between the LD-RC oscillator and the first and second MOS transistors (M1, M2), wherein a first controlled chopping switch (S1A) is placed between the control resistor (R) and the drain of the first MOS transistor (M1) of a first branch, whereas a second controlled chopping switch (S1B) is placed between the LD-RC oscillator and the drain of the second MOS transistor (M2) of a second branch, and wherein a third controlled chopping switch (S2B) is placed between the control resistor (R) and the drain of the second MOS transistor (M2), whereas a fourth controlled chopping switch (S2A) is placed between the LD-RC oscillator and the drain of the first MOS transistor (M1), and the first and second switches (S1A, S1B) being controlled by a first control signal (PH1) to be in conducting mode during a first phase P1, whereas the third and fourth switches (S2B, S2A) are controlled by a second control signal (PH2) to be in non-conductive mode during the first phase P1, the third and fourth switches (S2B, S2A) being controlled by the second control signal (PH2) to be in conducting mode during a second phase P2, whereas the first and second switches (S1A, S1B) are controlled by the first control signal (PH1) intended to be in non-conductive mode during the second phase P2, all the controlled chopping switches (S1A, S1B, S2B, S2A) being controlled by the switch control unit at least during a predefined time, which is a sleep time (Tsleep), or all the time of some parts of the system other than the oscillator stage, and during the predefined time or all the time, phases P1 and phases P2 alternating successively in order to perform a chopping operation by commuting the first and second MOS transistors (M1, M2) from phase P1 to phase P2, and from phase P2 to phase P1, wherein the LD-RC oscillator is a ring oscillator having an odd number n of CMOS inverters has the balance ensured via a feedback unit, which is implemented by an operational amplifier in the depicted case.

8. The method according to claim 7, wherein during a period corresponding to the predefined time or all the time, all the chopping switches (S1A, S1B, S2B, S2A) are commuted to pass successively from phase P1 to phase P2 and from phase P2 to phase P1, and each phase approximately during 50% of the time by phases P1 and 50% of time by phases P2.

9. The method according to claim 7, wherein the oscillating signal (F0) from the LD-RC oscillator is supplied to clock a timer of a switch logic unit to determine a sleep time before waking up all the system.

* * * * *